(12) United States Patent
Windisch, Jr. et al.

(10) Patent No.: US 6,761,985 B2
(45) Date of Patent: Jul. 13, 2004

(54) MAGNETIC TRANSPARENT CONDUCTING OXIDE FILM AND METHOD OF MAKING

(75) Inventors: Charles F. Windisch, Jr., Kennewick, WA (US); Gregory J. Exarhos, Richland, WA (US); Shiv K. Sharma, Honolulu, HI (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/972,237

(22) Filed: Oct. 4, 2001

(65) Prior Publication Data

US 2002/0132142 A1 Sep. 19, 2002

Related U.S. Application Data

(63) Continuation-in-part of application No. 09/685,013, filed on Oct. 5, 2000, now abandoned.

(51) Int. Cl.[7] .................. B32B 15/00; B32B 15/04; B32B 15/18; B32B 15/20
(52) U.S. Cl. .................. 428/699; 428/639; 428/640; 428/650; 428/630; 428/620; 428/446; 428/450; 428/432; 428/701
(58) Field of Search .................. 428/699, 639, 428/640, 650, 651, 652, 630, 631, 620, 446, 450, 432, 426, 700, 701, 702

(56) References Cited

U.S. PATENT DOCUMENTS

| | | | |
|---|---|---|---|
| 3,850,665 A | * 11/1974 | Plumat et al. | 117/33.3 |
| 4,204,028 A | * 5/1980 | Donley | 428/432 |
| 4,668,299 A | * 5/1987 | Nanao et al. | 106/309 |
| 4,880,772 A | 11/1989 | Pederson et al. | |
| 4,898,699 A | 2/1990 | Hofmann et al. | 264/43 |
| 5,688,442 A | 11/1997 | Ando et al. | 252/582 |
| 5,993,701 A | 11/1999 | Ando et al. | 252/582 |
| 6,221,495 B1 | * 4/2001 | Wu et al. | 428/432 |
| 6,306,525 B1 | * 10/2001 | Schicht et al. | 428/633 |
| 6,432,545 B1 | * 8/2002 | Schicht et al. | 428/432 |

FOREIGN PATENT DOCUMENTS

GB 2 013 724 8/1979

OTHER PUBLICATIONS

Appandairajan, NK et al., "A Study of $Co_{3-x}Ni_xO_4$ ($0 \leq x \leq 1$) System", p. 115–120. (Apr. 1978).

Biaramov, BH et al., "Raman Study of the Phonon Half-widths and the Phonon–Plasmon Coupling in ZnO", p. 227–234. 1983. (no month).

(List continued on next page.)

*Primary Examiner*—Michael La Villa
(74) *Attorney, Agent, or Firm*—Klarquist Sparkman, LLP

(57) ABSTRACT

Cobalt-nickel oxide films of nominal 100 nm thickness, and resistivity as low as 0.06 Ω·cm have been deposited by spin-casting from both aqueous and organic precursor solutions followed by annealing at 450° C. in air. Films deposited on sapphire substrates exhibit a refractive index of about 1.7 and are relatively transparent in the wavelength region from 0.6 to 10.0 $\mu$m. They are also magnetic. The electrical and spectroscopic properties of the oxides have been studied as a function of x=Co/(Co+Ni) ratio. An increase in film resistivity was found upon substitution of other cations (e.g., $Zn^{2+}$, $Al^{3+}$) for Ni in the spinel structure. However, some improvement in the mechanical properties of the films resulted. On the other hand, addition of small amounts of Li decreased the resistivity. A combination of XRD, XPS, UV/Vis and Raman spectroscopy indicated that $NiCo_2O_4$ is the primary conducting component and that the conductivity reaches a maximum at this stoichiometry. When x<0.67, NiO forms leading to an increase in resistivity; when x>0.67, the oxide was all spinel but the increased Co content lowered the conductivity. The influence of cation charge state and site occupancy in the spinel structure markedly affects calculated electron band structures and contributes to a reduction of p-type conductivity, the formation of polarons, and the reduction in population of mobile charge carriers that tend to limit transmission in the infrared.

15 Claims, 9 Drawing Sheets

OTHER PUBLICATIONS

Domansky, K et al., "*Localized Deposition of Zinc Oxide Films by Automated Fluid Dispensing Method*", p. 116–121. 2000. (no month).

Exharos, GJ et al., "*Spectroscopic Characterization of Processing–Induced Property Changes in Doped ZnO Films*", p. 56–62. 1997. (no month).

Ginley, DS et al., "*Transparent Conducting Oxides*", p. 15–18. (Aug. 2000).

Goodwin–Johansson, S et al., "*Artificial Eyelid for Protection of Optical Sensors*", p. 225–231. 2000. (no month).

King, WJ et al., "*The Reduction of Oxygen on Nickel–Cobalt Oxides–II*", p. 493–498. 1974. (no month).

Lefez, B et al., "*Characterization of Cobalite Spinels by Reflectance Spectroscopy*", p. 1263–1267. 1996. (no month).

Monkhorst, HJ et al., "*Special Points for Brillouin–Zone Integrations*", p. 5188–5192. 1976. (no month).

Mkeng, P et al., "*Characterizatioin of Spinel–Type Cobalt and Nickel Oxide Thin Films by X–Ray Near Grazing Diffraction, Transmission and Reflectance Spectroscopies, and Cyclic Voltammetry*", p. 1777–1783. (Jun. 1995).

Payne, MC et al., "*Iterative Minimization Techniques for ab initio Total–Energy Calculations: Molecular Dynamics and Conjugate Gradients*", p. 1045–1097. (Oct. 1992).

Perdew, JP et al., "*Self–Interaction Correction to Density–Functional Approximations for Many–Electron Systems*", p. 5048–5079. (May 1981).

Roginskaya, YE et al., "*Characterization of Bulk and Surface Composition of $Co_xNi_{1-x}O_y$ Mixed Oxides for Electrocatalysis*", p. 4621–4627. 1997. (no month).

Schumacher, LC et al., "*Semiconducting And Eectrocatalytic Properties of Sputtered Cobalt Oxide Films*", p. 975–984. 1990. (no month).

Tareen, JAK et al., "*Growth and Electrical Properties of Pure and Ni–Doped $Co_3O_4$ Single Crystals*", p. 989–997. 1984. (no month).

Vanderbilt, D et al., "*Soft Self–Consistent Pseudopotentials in a Generalized Eigenvalue Formalism*", p. 7892–7895. (Apr. 1990).

Vasil'ev, GP. et al., "*Structural and Electrical Properties of D.C. Sputtered $MnCo_2O_4$ Films*", p. 119–124. 1989. (no month).

Windisch, CF. et al., "*Infrared Transparent Spinel Films with P–type Conductivity*", p. 45–52. 2001. (no month).

Windisch, CF. et al., "*Synthesis and Characterization of Transparent Conducting Oxide Cobalt–Nickel Spinel Films*", p. 1647–1651. (Jul./Aug. 2001).

Zhecheva, E. et al., "*Lithium Doping of Cobalt–Nickel Spinel Oxides at Low Temperatures*", p. 593–602. 1996. (no month).

\* cited by examiner

MAGNETIC TRANSPARENT CONDUCTING OXIDE FILM AND METHOD OF MAKING

CROSS REFERENCE TO RELATED APPLICATION

This is a Continuation-In-Part of U.S. patent application Ser. No. 09/685,013 filed Oct. 5, 2000, now abandoned.

This invention was made with Government support under Contract DE-AC0676RLO1830 awarded by the U.S. Department of Energy. The Government has certain rights in the invention

FIELD OF THE INVENTION

The present invention is a transparent conducting oxide film and a method of making such a film. The film has the properties of good conductivity, stability, and extended transmissivity into the infrared. The film may be used as an optical coating for devices including, but not limited to, infrared sensors, actuators, light emitting diodes, transistors, solar cells, and flat panel displays.

DESCRIPTION OF RELATED ART

Transparent conducting oxide (TCO) film materials are under development for many applications that include coatings for flat panel displays, sensors[1], optical limiters and switches[2], and a variety of devices that rely on the non-linear optical response of their components[3]. Most TCO films currently under development are n-type semi-conducting materials. Unfortunately, attendant high conductivity limits their transmissivity in the infrared. There is an increased demand for optical transparency at these wavelengths, which seeks to develop conducting oxide coatings with good optical transmission in the 1 to 12 micrometer wavelength band. In many of these existing n-type oxide-based materials, the presence of free carriers associated with enhanced conductivity, also induces long wavelength absorption thereby limiting transmission in this region. Although desirable for many applications, such as heat reflecting windows, the infrared-blocking behavior can be a detriment to the performance of sensors in the infrared and near infrared regions and for non-linear optical devices that are required to operate at longer wavelengths.

BRIEF SUMMARY OF THE INVENTION

Presently disclosed are methods and composition for an infrared transparent conducting oxide optical film adhered to an infrared transparent substrate, wherein the optical film comprises a mixed transition metal oxide spinel compound of the form $M1_{1-x}M2_xO_{4/3}$, wherein M1 and M2 are two different transition metals and x is less than or equal to 1. M1 and M2 can be selected from any of the Group VIII elements such as Fe, Co, Ni, Ru, Rh, Pd, Os, Ir and Pt. It is advantageous for M1 and M2 to be transition metals with more than one oxidation state, preferably +2 and +3, and that they be in a spinel type crystal structure. A preferred mixed transition metal oxide spinel compound is $NiCo_2O_4$. Although still p-type in nature, films of these mixed cobalt-nickel oxide compositions exhibit higher conductivity because of the contribution of polaron hopping to the conduction mechanism. Additionally, the films can be made thin enough to provide adequate transmissivity from visible wavelengths out to the 12-micrometer infrared region. Other mixed transition metal oxide compounds also were found to exhibit high p-type conductivity and wavelength transmissivity from the visible to wavelengths at least as long as 12 micrometers. One such example is the palladium nickel oxide spinel of nominal composition $PdNi_2O_4$. Variations in the Pd:Ni ratio also were found to give conducting transmissive films. The substrate used in this invention can be any infrared transparent material substrate such as, but not limited to, sapphire, silicon, zinc selenide and quartz.

In another aspect of the present invention, the optical film comprises a mixed transition metal oxide spinel compound of the form $M1_{1-x}M2_xO_{4/3}$, wherein M1 and M2 are two different transition metals and x is less than or equal to 1 and further comprising Li. It is advantageous to use trace to about 10% Li. It is believed that addition of small amounts of Li to the metal oxide films of the instant invention will enhance conductivity.

In another aspect of the present invention, a method of making an infrared transparent conducting oxide film on an infrared transparent substrate is provided. This method comprises the steps of preparing a precursor solution comprising nitrates of two transition metals and a reducing agent; spin casting the precursor solution to form a film on the substrate, and inducing the transparent conducting oxide formation on the substrate by thermal treatment of the film. The reducing agent is preferably glycine but could also be malonic acid or any other soluble reducing agent that assists the combustion process. It is important for the reducing agent to completely volatilize after the thermal treatment. The thermal treatment is to be provided under conditions that achieve minimum initiation combustion temperature. The duration of the thermal treatment is dependant upon the duration of the thermal treatment. For example, if the temperature of the thermal treatment is 500° C., the corresponding duration of the treatment is about 10 minutes. Should the temperature used be less than 500° C., the duration of the treatment would then increase to accommodate. The principle approach to the thermal treatment is to assure that the oxide is not being decomposed while achieving the minimum initiation combustion temperature.

In another aspect of the present invention, a method of making an infrared transparent conducting oxide film on an infrared transparent substrate is provided. This method comprises the steps of preparing thinned metal targets from metal alloy by milling to fit within a magnetron sputter cathode and sputtering the film onto the substrate in an atmosphere of pure oxygen at a partial pressure.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION OF THE INVENTION

Figure 1:
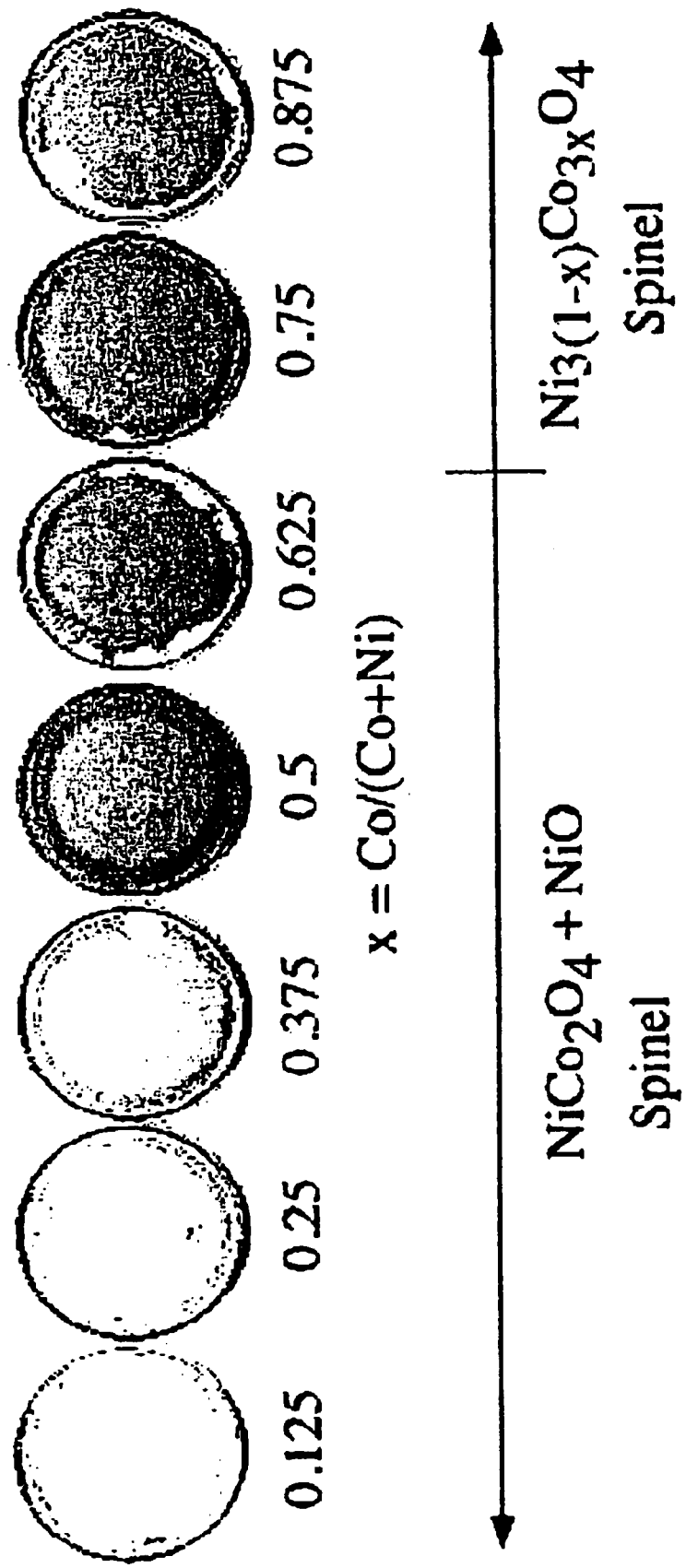
FIG. 1 illustrates the variation in tint of a single layer of Nickel-Cobalt oxide film with x=Co/(Co+Ni).

The present invention is a transparent conducting oxide film and a method of making such a film. In one of numerous embodiments of the present invention disclosed herein, the film (coating) comprises a mixed transition metal oxide spinel compound of the form $M1_{1-x}M2_xO_{4/3}$ whereby M1 and M2 are two different transition metals (e.g., Ni and Co) and x is less than or equal to 1. The film has the properties of good conductivity, stability, and extended transmissivity into the infrared. The film may be used on any infrared transparent substrate such as, but not limited to, sapphire, silicon, zinc selenide and quartz. The film may be used as an optical coating for devices including, but not limited to, infrared sensors, actuators, light emitting diodes, transistors, solar cells, and flat panel displays.

Our initial studies focused on p-type semi conducting oxide materials that typically showed excellent infrared transmissivity but markedly lower conductivity when compared to their n-type counterparts. Two p-type materials that were studied extensively were $Co_3O_4$ and NiO. Coincidentally, it was found that mixed oxides of Co and Ni (e.g., $NiCo_2O_4$) gave higher conductivities, up to 5 orders of magnitude more than either of the two individual oxides. Although still p-type in nature, films of these mixed cobalt-nickel oxide compositions exhibit higher conductivity because of the contribution of polaron hopping to the conduction mechanism. Additionally, the films can be made thin enough to provide adequate transmissivity from visible wavelengths out to the 12-micrometer infrared region. In addition, other mixed transition metal oxide compounds also were found to exhibit high p-type conductivity and wavelength transmissivity from the visible to wavelengths at least as long as 12 micrometers. One such example is the palladium nickel oxide spinel of nominal composition $PdNi_2O_4$. Variations in the Pd:Ni ratio also were found to give conducting transmissive films. Addition of small amounts of Li to the cobalt-nickel oxide films was also observed to enhance conductivity. For example, when 10 mole percent Li (relative to the total number of moles of Co and Ni) were added to the $NiCo_2O_4$ material, the conductivity increased by about a factor of two. Finally, it was found that different fabrication methods gave films with different conductivities.

The general criteria for achieving p-type conducting films of this sort include the following: (1) the phase typically is a stoichiometric mixed metal phase although non-stoichiometric phases that produce lower conductivity also have been prepared and characterized; (2) typically at least two transition metal cations of variable charge state are present (three or more cation containing systems also were found to produce films of the subject type; (e.g., aluminum could be added to such films to enhance mechanical properties while marginally decreasing the conductivity); the cations typically reside on either octahedral or tetrahedral lattice sites depending upon their oxidation state and size; (3) the invention is not restricted to oxide systems but is meant to include other divalent chalcogenide anions such as sulfur, selenium, and tellurium, as well as trivalent group V atoms including nitrogen, phosphorus, arsenic, antimony, and bismuth; (4) the material is not limited to the spinel crystal type; (5) the invention includes the addition of small amounts (less than the total amount of the other metal ions) of Li to the spinel composition (Li is believed to occupy tetetrahedral sites within the spinel crystal structure).

The synthetic routes used to prepare the subject films are described herein along with a qualitative interpretation of their properties based upon semi-empirical computations of electron energy bands as a function of cation charge and lattice site occupancy. Based upon previous work that used Raman spectroscopy methods to characterize TCO ZnO films[4], this inelastic light scattering technique proved to be a rapid method for characterization of the spinel phase in these mixed oxide systems. Measured film conductivity data also provides insight for the interpretation of spectral properties, not only in the visible spectrum but also in the infrared region[5].

Experimental Procedure

Cobalt-nickel oxide films of nominal 100 nm thickness, and resistivity as low as 0.06 Ω·cm have been deposited by spin-casting from both aqueous and organic precursor solutions followed by annealing at 450° C. in air. Films deposited on sapphire substrates exhibit a refractive index just over 1.7 at visible wavelengths and 1.62 at 2 micrometers in the near infrared region; these films are relatively transparent in the wavelength region from 0.6 to 10.0 μm. They are also magnetic. The electrical and spectroscopic properties of the oxides have been studied as a function of x=Co/(Co+Ni) ratio. An increase in film resistivity was found upon substitution of some cations (e.g., $Zn^{2+}$, $Al^{3+}$) for Ni in the spinel structure. However, some improvement in the mechanical properties of the films resulted. Conversely, addition of Li was found to decrease film resistivity. Incorporation of 10 mole percent Li to $NiCo_2O_4$ (relative to the total amount of Ni and Co), for example, decreased resistivity by approximately a factor of two.

A combination of XRD, XPS, UV/Vis and Raman spectroscopy indicated that $NiCo_2O_4$ is the primary conducting component for the cobalt-nickel oxide compositions and that the conductivity reaches a maximum at this stoichiometry. When x<0.67, NiO forms leading to an increase in resistivity; when x>0.67, the oxide was all spinel but the increased Co content lowered the conductivity. The variation in cation charge state and site occupancy in the spinel structure markedly affects calculated electron band structures and likely influences the contribution of p-type conductivity, the formation of polarons and the reduction in population of mobile charge carriers that tend to limit transmission in the infrared. The maximum effect on conductivity is seen at x=0.67. Electronic structure modeling studies suggest the important role of the oxidation state of the Ni cations in the conduction mechanism. XPS results, which show the presence of a higher-binding energy "defect" $O_{1s}$ state that scales with conductivity, suggest that the Ni cations are more covalently bonded to the oxygen ions than are the Co cations. Although present in the +3 state, the Ni cations share electrons more strongly with the oxygen ions, creating a stationary charge-separated state which is identified with the existence of polarons in this family of materials. Finally, Raman spectra of the films were relatively easy to obtain and therefore were useful as a routine tool for identifying composition and optimizing conductivity. These spectra also indicate that the effects of Ni additions result in modification of the structure of the octahedral sites.

A number of film deposition procedures have been developed for depositing the spinel phase of these films. These procedures comprise, but are not limited to, solution deposition processing, reactive sputter deposition, and pulsed laser ablation.

The solution deposition processing route is described as follows. Cobalt-nickel oxide films of known stoichiometry were deposited from precursor solutions containing the respective metal nitrates and an organic complexant. Subsequent thermal annealing induced oxide formation during which the organic component was fully oxidized to gaseous products[6]. The precursor solutions were made by dissolving $Co(NO_3)_2 \cdot 6H_2O$ and $Ni(NO_3)_2 \cdot 6H_2O$ in deionized water. Additions of Al, Zn and Cu were effected by using $Al(NO_3)_3 \cdot 9H_2O$, $Zn(NO_2)_2 \cdot 6H_2O$ and $Cu(NO_3)_2 \cdot 3H_2O$, respectively. Total nitrate solids loading was about 2 g per 10 mL of solution. All precursor solutions also contained glycine at about 1 g per 10 mL of solution. Films were prepared by spin casting these solutions at 3500 rpm for 30 s onto clean optical quality fused silica, sapphire, and Si substrates. After casting, the films were heated in air at 350° C. for 10 min. to initiate oxidation that converted the precursors to an oxide phase. A single coat from the above solutions gave film thicknesses on the order of 25 nm. Thicker films (up to 100 nm) were made by sequentially casting/heating several layers. The minimum resistivity for these films, measured on the $NiCo_2O_4$ composition, was 0.06 Ω·cm. Transmission at 15 $\mu$m was about 90%.

Spin coating Si substrates with the aqueous glycine formulation precursors described above proved to be problematic even though extreme measures were used to prepare the Si surfaces. This included detergent washing and treatment in an oxidizing $H_2SO_4/H_2O_2$ solution. An ethanolic solution of the nitrates and malonic acid (in similar proportions to the aqueous glycine formulations described above was used instead. This alternate precursor solution exhibited better surface tension properties on Si and resulted in optical quality films.

Films also have been deposited by means of reactive rf (radio frequency) magnetron sputtering methods. Methods for sputtering deposition can be utilized for making an infrared transparent conducting oxide film on an infrared transparent substrate. In general, preparing an alloy of the metals M1 and M2 selected from any of the group VIII elements with concentration ratios desired for the oxide to be fabricated. Using the alloy as a metal target for rf magnetron sputtering whereby the sputtering process is performed in a pure oxygen environment.

In this technique thinned metal targets of nominal composition 33.3% Ni and 66.7% Co were milled to fit within the magnetron sputter cathode. The target restriction is not restricted and other binary and tertiary metal alloys can be used to sputter deposit these films. Films were sputtered in an atmosphere of pure oxygen at a partial pressure on the order of 10 millitorr. Substrate to target distance was held at a nominal 25 cm although other distances also may be used. The high oxygen content is necessary to insure that only the oxidized form of the precursor metal atoms are present in the film. The parameters used for reactive sputtering are critical to deposition of the spinel phase, which was characterized by Raman spectroscopy. Films on the order of 100 nm thick had a measured conductivity of 0.003 ohm-cm, a refractive index of 1.62 at 2000 nm, and high transmissivity in the infrared. Films also could be deposited using pulsed laser ablation route where the powdered spinel ceramic material is compressed into a disk, then irradiated with pulsed visible or UV radiation (on the order of 1 $J/cm^2$) to form the plasma that deposits a film on a substrate in contact with the plasma plume in a vacuum chamber with a base pressure of about 10 millitorr of oxygen. Again, the substrate target distance is variable as in the sputter deposition example.

It also is observed that post deposition treatment in an oxidizing atmosphere at temperatures not to exceed about 450 degrees C can lead to improvement in properties for films deposited by any of these methods. Heating to temperatures in excess of this temperature or in reducing environments diminishes the conductivity due to phase decomposition.

The films were characterized using several techniques including optical and scanning electron microscopy (SEM) (appearance and morphology); Hall measurements (electrical properties); X-ray diffraction (XRD), X-ray photoelectron spectroscopy (XPS) and Raman spectroscopy (chemical composition); spectroscopic ellipsometry, UV/Vis/NIR and Infrared spectroscopy (optical properties); picoindentation (mechanical properties).

Electronic Structure Modeling Approach

First principles DFT calculations utilizing ultrasoft pseudopotentials[7] were performed on the mixed $[Co_3O_4]_x$-$[Ni_3O_4]_{1-x}$ system using the CASTEP electronic structure program[8]. The metal-oxide unit cells were based upon the $Fe_3O_4$ magnetite prototype. The exchange-correlation contribution to the total electronic energy is treated in the spin-polarized version of the Perdew-Zunger parameterization of the local density approximation[9]. The electronic wavefunctions were expanded using a plane wave basis set with an energy cutoff of 450 eV. At this cutoff, the total energy convergence of the cell was typically less than 0.1 eV. Reciprocal space integration over the Brillouin zone was approximated using the Monkhorst-Pack scheme over a finite number of k-points[10]. Mulliken population analyses were performed using a 3.0 Å cutoff.

Results

Films were prepared as described in the Experimental Procedure and subjected to analysis. The results for the various characterization studies are described below, followed by a discussion of the results in light of the literature and more recent modeling activities.

Figure 2:
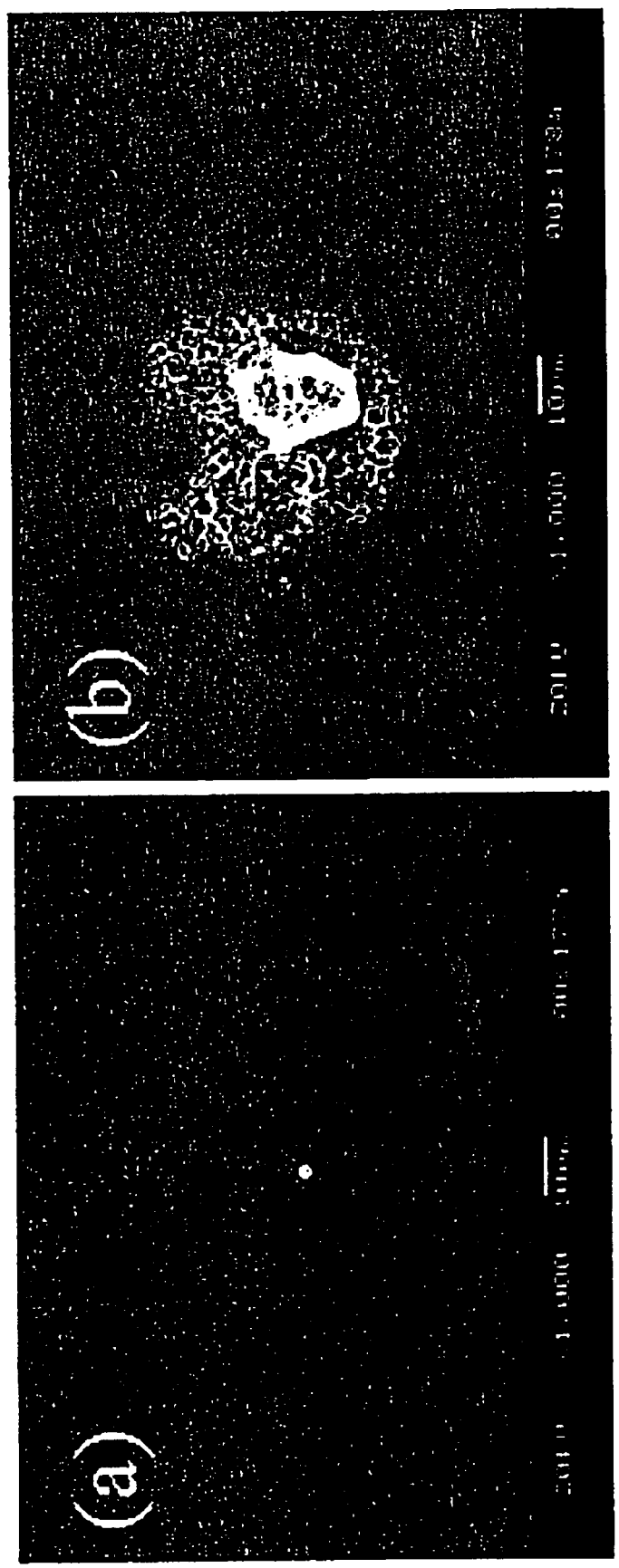
FIG. 2 is a set of SEM images of $NiCo_2O_4$ films composed of (a) one layer and (b) three layers. The spot in the center of (a) is a debris particle used for focus. The pit shown in (b) is due to processing.

Appearance and Morphology:

As shown in FIG. 1, single coatings of the cobalt-nickel oxide films were optically clear with a grayish-brown tint that darkened with increasing Co content up to about x=0.67, where x=Co/(Co+Ni). Above x=0.67, the films lightened slightly. Single layers of the films appeared perfectly uniform with no visible structure under an optical microscope and showed a flat, uniform morphology with SEM (FIG. 2a) up to magnifications as high as 10,000×. Films with multiple layers typically contained isolated 10–100 $\mu$m size defects (FIG. 2b). These defect sites often contained smaller pores and particles, which were probably formed by an eruption of gaseous byproducts from combustion or reaction of material in underlayers. The results indicate that single coatings of the cobalt-nickel oxides can be easily prepared with good optical quality whereas multiple coatings require further refinement of procedures. Film thickness was 20–30 nm per layer as determined from spectroscopic ellipsometry measurements; and indices on the order of 1.74 were determined by fitting the data to a damped harmonic oscillator dispersion relationship.

Figure 3A:
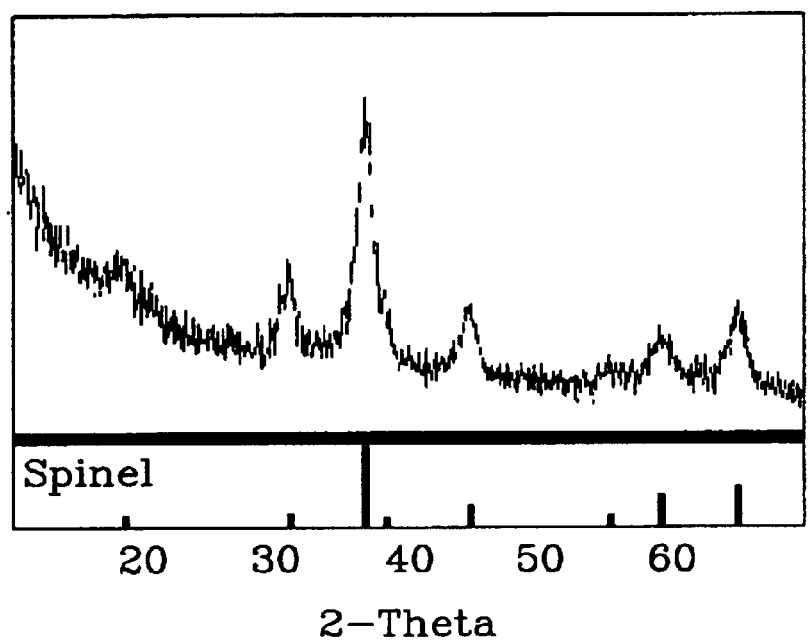
FIG. 3 shows (a) XRD pattern of 60-nm thick $NiCo_2O_4$ (x=0.67) film and (b) variation of lattice parameter with film composition (x).
Figure 3B:
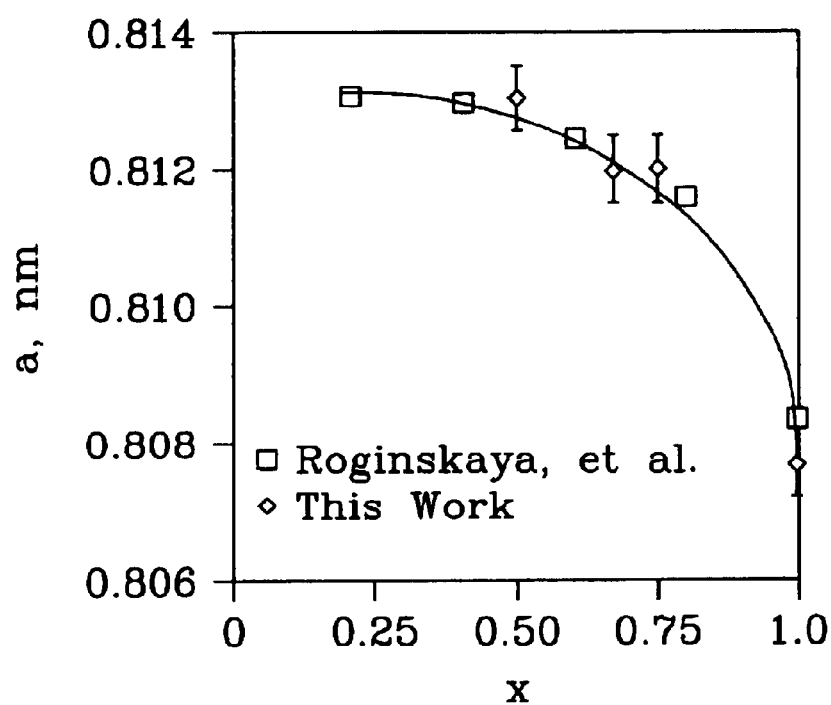
Figure 4:
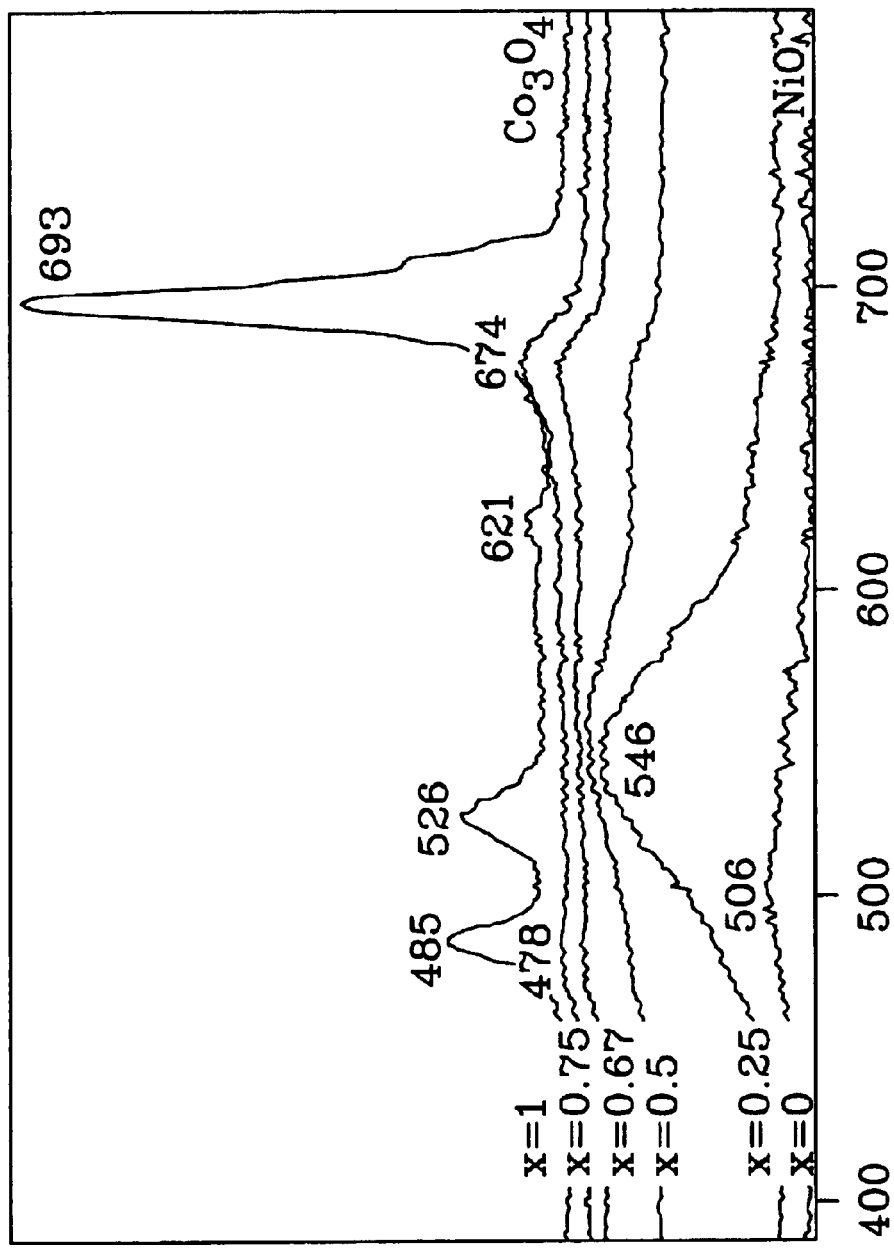
FIG. 4 illustrates Raman spectra of Cobalt-Nickel oxide films as a function of composition (x).
Figure 5:
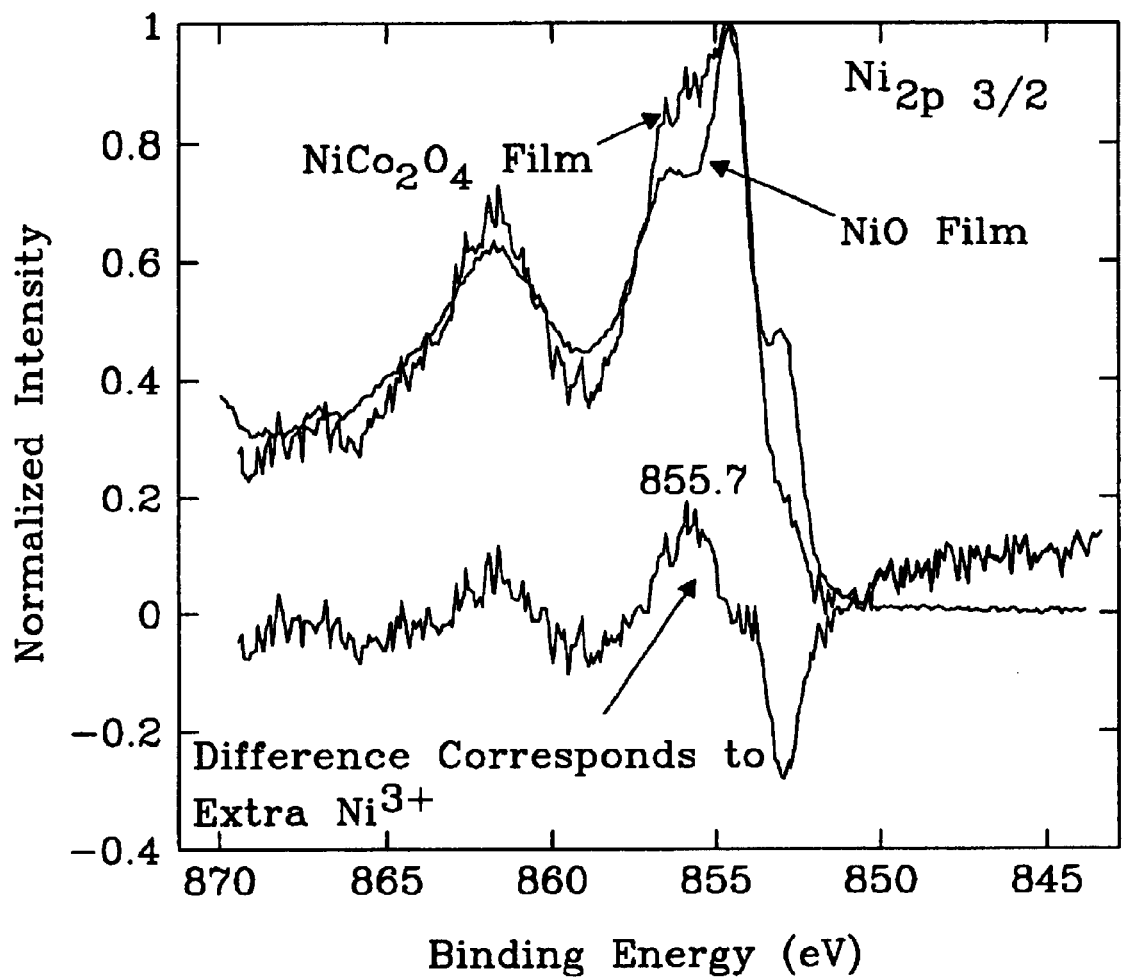
FIG. 5 illustrates XPS spectra showing $Ni_{2p}$ peaks. Comparison of spectra of $NiCo_2O_4$ and NiO films showed extra peaks for $NiCo_2O_4$ that were similar to spectrum of $Ni_2O_3$, suggesting presence of $Ni^{3+}$.
Figure 6:
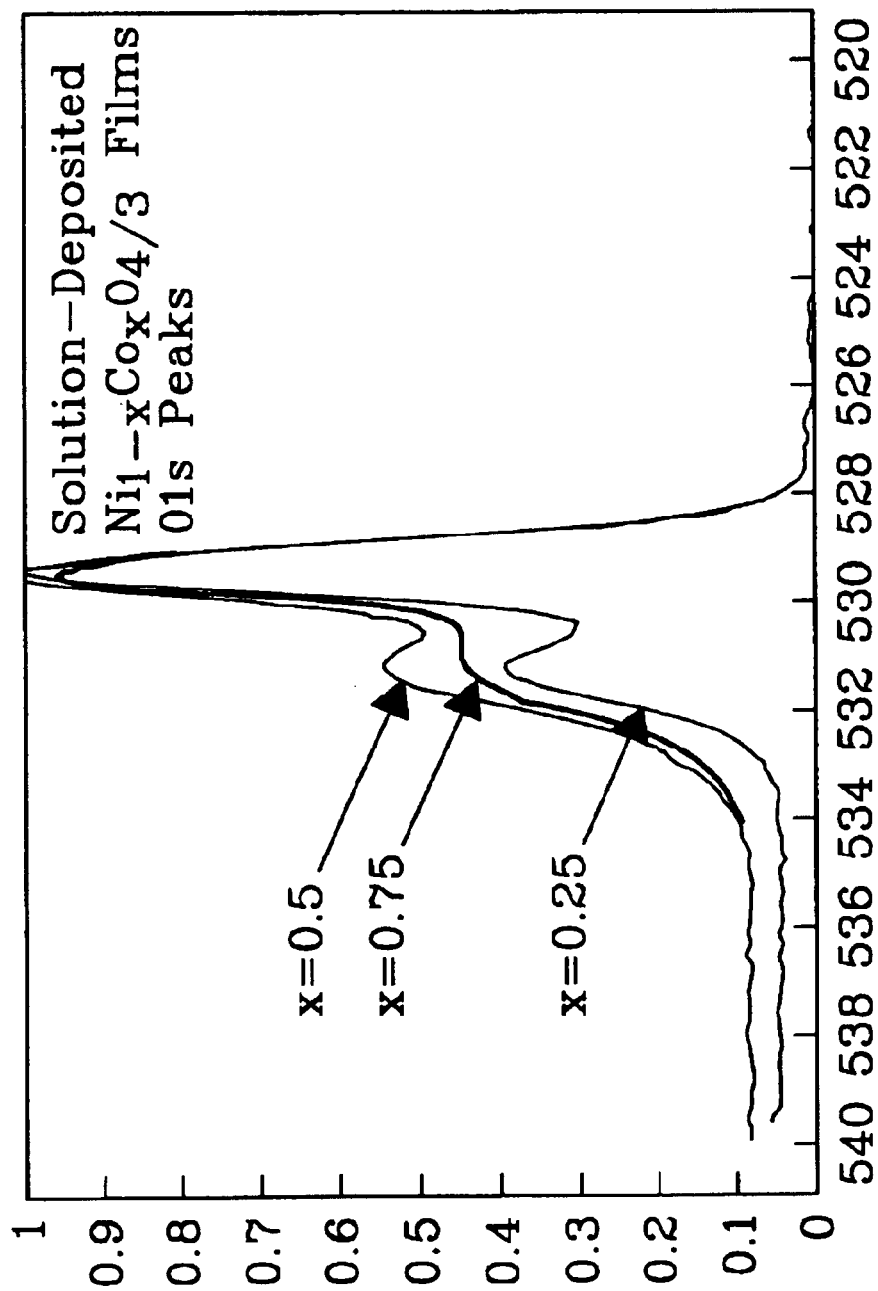
FIG. 6 illustrates XPS spectra showing $O_{1s}$ peaks. The higher binding energy feature is associated with defective oxygen structures that increase in population with Ni content, as well as conductivity.

Composition:

The composition of the cobalt-nickel oxide films was determined by XRD, Raman spectroscopy, and surface analysis. As shown in FIG. 3a, a film with $NiCo_2O_4$ stoichiometry (as prepared from its precursors) exhibited an XRD pattern characteristic of the spinel structure. As x was varied between 0.67 and 1.0, the predominant component of the film was spinel although the lattice parameters shifted with x in a manner consistent with substitution of Co for Ni in the spinel structure (FIG. 3b)[11]. Below x=0.67, the spinel pattern was accompanied by peaks from cubic NiO. The Raman spectra of the films also varied with composition as shown in FIG. 4. The spectrum of $Co_3O_4$ is consistent with the literature[12], while the spectra of the cobalt-nickel oxide series are, as far as we are aware, the first published Raman data for thin films of these compositions. These spectra were clear and distinct even for films as thin as 60 nm. Infrared spectra for cobalt-nickel oxides have been previously published[13,14]. Surface analysis by XPS (FIG. 5) revealed additional detail on the distribution of Ni ions within the film. The $Ni_{2p}$ peaks contained fine structure that could be associated with $Ni^{3+}$ in the compound[11]. Factor analysis gave a $Ni^{3+}$ content of about 10%, which is similar to that reported previously[15]. The $O_{1s}$ peak (FIG. 6) reveals a higher binding energy state. The intensity of this feature increases with the amount of Ni in the film, up to the $NiCo_2O_4$ composition, and also with the film conductivity, for films fabricated by both spin casting and sputter deposition. This higher-binding energy state is associated with the more covalently bound Ni ions at octahedral sites that are responsible for the enhancement in conductivity.

Figure 7:
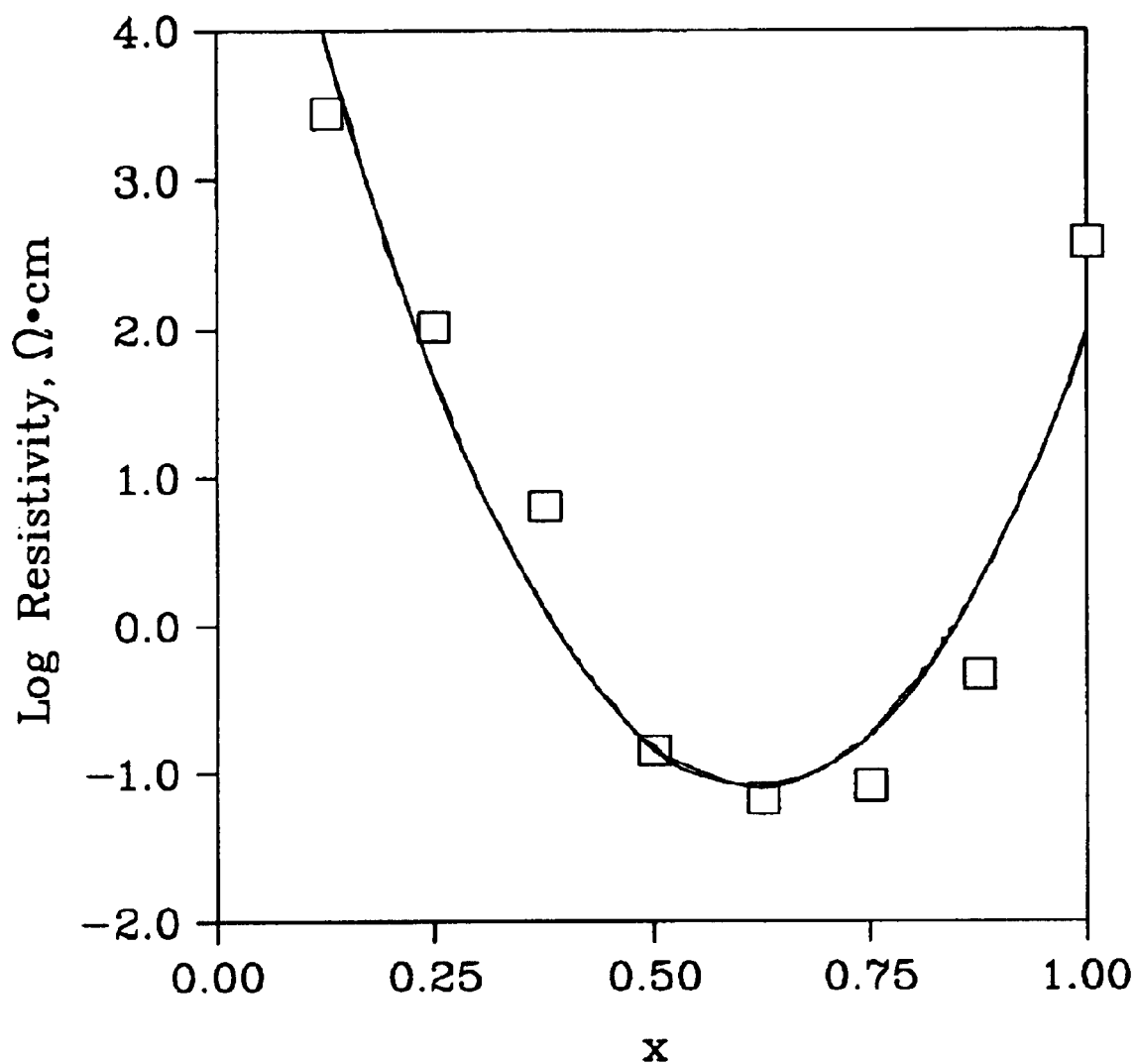
FIG. 7 illustrates the variation of resistivity of Cobalt-Nickel oxide films with composition x, where x=Co/(Co+Ni). Resistivity is a minimum at x=0.67.

Electrical Properties:

The resistivity of the cobalt-nickel oxide films varied with composition as shown in FIG. 7, exhibiting a minimum (approximately 0.06 Ω·cm for the spin-casted films) at x=0.67. Apparently, conductivity is maximum for the stoichiometric compound $NiCo_2O_4$ (x=0.67), and decreases when Co replaces Ni in the spinel lattice (x>0.67) or when NiO is present (x<0.67).

Measured resistivity of about 0.06 Ω·cm for spin-cast films and 0.003 Ω·cm for sputter deposited films are significantly lower than resistivities measured on cobalt nickel oxide films synthesized from nitrates in the absence of reducing agents like glycine or malonic acid. This suggests and important role for these reducing agents in a precursor solution[17].

Hall measurements indicated that both NiO and $Co_3O_4$ are p-type conductors, as expected[16], with free carrier concentrations less than $10^{16}$ cm$^{-3}$. As x varies away from either of these end members, the free carrier concentration increases, consistent with the increase in conductivity. There is some question as to the conduction mechanism in the mixed cobalt-nickel oxides, however. Compounds in this series have been variously described as p-type[15], semimetallic-to-metallic suggesting n-type[17], and p-type with doping by $Ni^{3+}$[18]. Results obtained in this work support a conductivity mechanism that involves a combination of p-type conductivity and polaron hopping, the latter being enhanced by the addition of Ni cations and the subsequent covalent interactions of Ni and O ions at octahedral sites.

Figure 8A:
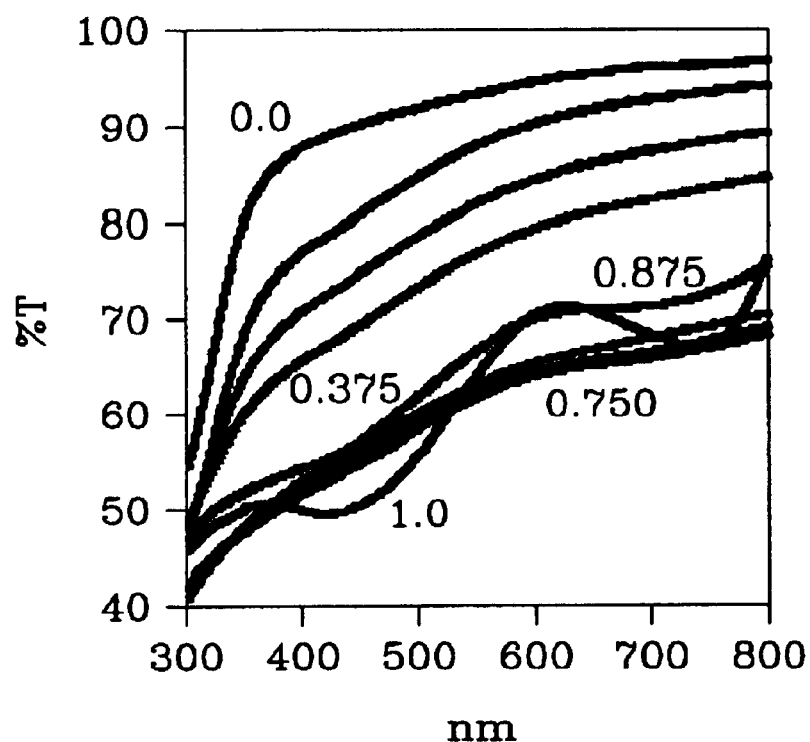
FIG. 8 illustrates (a) visible transmission spectra of single-layer Cobalt-Nickel oxide films as a function of composition (x) and (b) infrared transmission spectrum of single-layer $NiCo_2O_4$ film.

Optical Properties:

As described above, the cobalt-nickel oxide films were optically clear but darkened slightly as x increased up to x=0.67. Above x=0.67, some slight variation in tint was also apparent. These observations are consistent with the transmission spectra shown in FIG. 8a. A NiO film shows very little absorption in the visible spectrum. At least two broad bands grow in the 300–800 nm region as Co is added and the amount of spinel increases. Above x=0.67, the effects of Co substituting for Ni in the spinel are observed. These changes are more complicated and involve a narrowing of the absorption peaks and additional increases in intensity. The overall effect on appearance is a very slight lightening of the films.

Figure 8B:
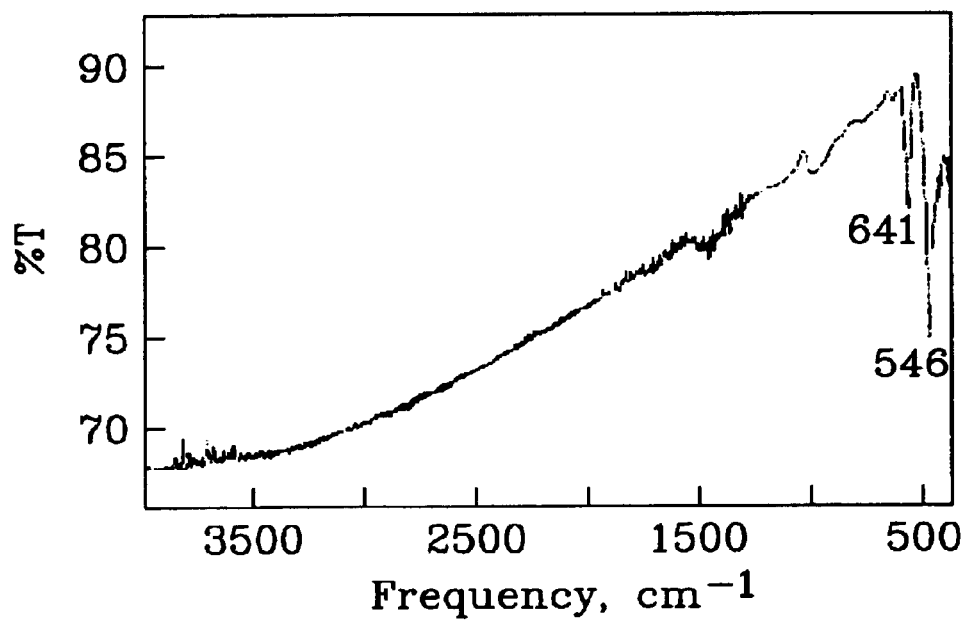

Transmission in the infrared region is good. A 100-nm thick film exhibits approximately 90% transmission at 15 $\mu$m (667 cm$^{-1}$) (FIG. 8b). There are a few absorption bands at slightly longer wavelengths, however keeping the films thin can minimize the effect of these bands. More importantly, the absorption edge that typically reduces the utility of n-type conductors as coatings for infrared optics is not observed in the case of $NiCo_2O_4$.

Figure 9:
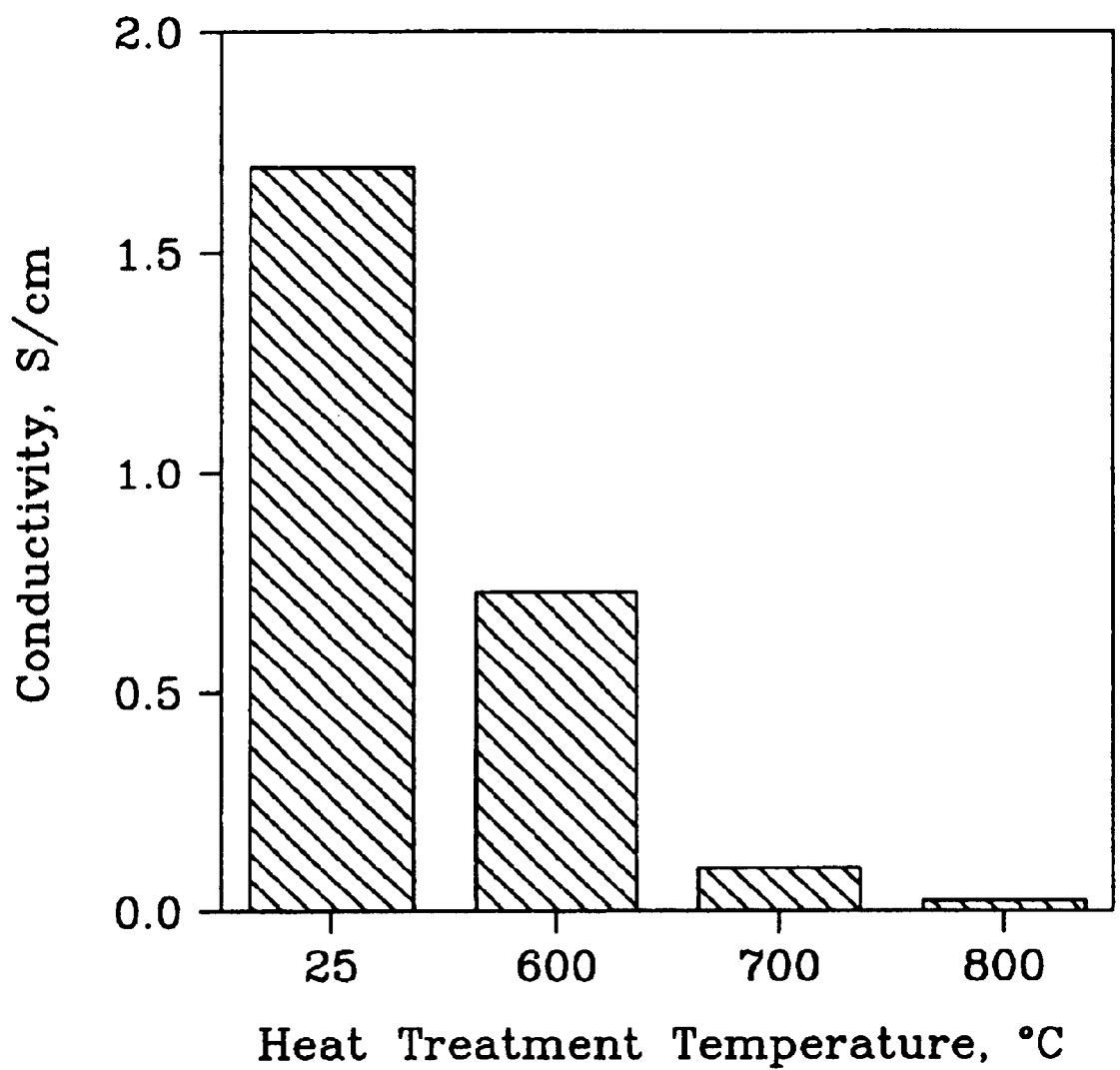
FIG. 9 illustrates the effect of 10-minute heat treatments on conductivity of $NiCo_2O_4$ films.

Other Properties:

The effects of annealing temperature and additional chemical additives were also studied in this work. Heating the films to temperatures above the annealing temperature, 450° C., has the effect of increasing film resistivity as shown in FIG. 9. XRD analysis of these heat-treated films showed the presence of $Co_3O_4$ and NiO, which apparently form and degrade conductivity when the $NiCo_2O_4$ phase separates.

When nitrates of Cu, Zn, and Al were incorporated in the precursor solutions, the resulting oxide films were less conductive than the cobalt-nickel oxide films without the additional components. Some physical properties were improved by these additions, however. The films were mechanically stronger when they contained Al, for example. Elastic moduli measured with a picoindenter increased about ⅓ in value with the addition of Al (at 10 mol percent of metal cation content) although, as described above, resistivity also increased significantly. The improved mechanical properties can also be easily observed by gently rubbing the films. The Al-containing films are clearly more scratch-resistant than films without Al.

Structural Modeling:

The structural parameters resulting from the first principles electronic structure computations of $Co_3O_4$, $Ni_3O_4$, $Ni[Co_2]O_4$, $Co[NiCo]O_4$, and $Co[CoNi]O_4$ are given in Table 1. It should be noted that there are three substitutional isomers (of similar higher

TABLE 1

Structural and Energetic Parameters for the $A[B_2]O_4$ mixed-oxide system.
(Values in parentheses indicate number of bonds)

| System | Cell Energy (eV) | Cell Param (a = b = c) | Metal-Oxygen Bond Distances | | | |
|---|---|---|---|---|---|---|
| | | | Co(tet)-O | Ni(tet)-O | Co(oct)-O | Ni(oct)-O |
| $Co_3O_4$ | −8284.92143 | 5.7491 | 1.874 (4) | | 1.969 (6) | |
| $Ni_3O_4$ | −9807.63029 | 5.6449 | | 1.853 (4) | | 1.926 (6) |

TABLE 1-continued

Structural and Energetic Parameters for the A[B$_2$]O$_4$ mixed-oxide system.
(Values in parentheses indicate number of bonds)

| System | Cell Energy (eV) | Cell Param (a = b = c) | Metal-Oxygen Bond Distances | | | |
|---|---|---|---|---|---|---|
| | | | Co(tet)-O | Ni(tet)-O | Co(oct)-O | Ni(oct)-O |
| Ni[Co$_2$]O$_4$ | −8793.02248 | 5.7021 | | 1.858 (4) | 1.953 (6) | |
| Co[NiCo]O$_4$ | −8798.75331 | 5.8625 | 1.893 (2) | | 2.021 (6) | 2.000 (2) |
| | | | 1.902 (2) | | | 1.992 (4) |
| Co[CoNi]O$_4$ | −8798.76292 | 5.8533 | 1.895 (2) | | 2.027 (2) | 1.998 (2) |
| | | | 1.902 (2) | | 2.017 (4) | 1.987 (4) | symmetry) for the mixed oxide spinel structure reflecting the presence of both tetrahedral and octahedral metal cation sites. We have chosen to use the King nomenclature[15] to distinguish these sites, where A[B$_2$]O$_4$ defines the parent spinel structure with A being the tetrahedral site and B the octahedral site. Comparing the mixed-oxides with the parent compositions (Co$_3$O$_4$, Ni$_3$O$_4$), there was a small increase in the cell parameters for the mixed metals in the octahedral sites. The metal-oxide bond lengths reflected both the lowered symmetry and the different bonding characteristics of these metals. The Co[NiCo] O$_4$ and Co[CoNi] O$_4$ compositions which locate the Ni$^{2+}$ cation in the octahedral sites are both noted to have lower energies than the Ni(Co$_2$) O$_4$ system, in accordance with conventional wisdom of the relative stabilities of Co and Ni cations.

Mulliken population analyses were performed for Co$_3$O$_4$, Ni$_3$O$_4$, Ni[Co$_2$]O$_4$, Co[NiCo]O$_4$ and Co[CoNi]O$_4$, and are given in Table 2. The mixed-oxide compositions demonstrated greater variations in the charge populations compared to the parent oxides than the differences between the site locations. The most notable differences are for the A site cobalt cation (tetrahedral) of the mixed oxide compared to Co$_3$O$_4$; however, in these cases the B site nickel charge remains close to its parent oxide. Closer analysis of the oxygen site populations reveals compensating charge variations. Preliminary

TABLE 2

Net atomic charges determined by Mulliken population analyses
for the parent and mixed-oxide Co-Ni systems.

| System | CO$_{tet}$ | Ni$_{tet}$ | CO$_{oct}$ | Ni$_{oct}$ |
|---|---|---|---|---|
| Co$_3$O$_4$ | 0.21 | | 0.46 | |
| Ni$_3$O$_4$ | | 0.71 | | 0.77 |
| Ni[Co$_2$]O$_4$ | | 0.74 | 0.35 | |
| Co[NiCo]O$_4$ | 0.62 | | 0.73 | 0.82 |
| Co[CoNi]O$_4$ | 0.63 | | 0.74 | 0.83 | oxidation state behavior has noted that the mixed-oxide composition contains a mixture between the (2+) and (3+) states for Ni. While these results are consistent with the population analyses, one must exercise caution not to over interpret the results of a particular charge partitioning scheme.

CLOSURE

Single and multi-layer films of cobalt-nickel oxide were synthesized and characterized using a variety of techniques. The films were conductive largely due to the presence of a spinel, NiCo$_2$O$_4$, phase. Single-layer, 20-nm thick, films with composition equivalent to NiCo$_2$O$_4$ exhibited resistivities as low as 0.003 Ω·cm. The films absorbed in the visible but were transparent in the infrared. Raman spectroscopy was found to be a useful technique to characterize film composition and corroborated compositional variations measured with XRD. Surface analysis indicated the presence of Ni$^{3+}$ in the material as well as defect oxygen ions, which together form the structural basis for polarons responsible for the film's quasi-metallic conductivity. Structural modeling of the mixed oxides finds the preferential coordination for the nickel cation to be octahedral with differential metal-oxide bond characteristics and charge distributions, but similar cell parameters.

While embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

REFERENCES

1. K. Domansky, A. Rose, W. H. Gover, and G. J. Exarhos, Materials Science and Engineering B, 76, 161 (2000).
2. S. Goodwin-Johansson, P. H. Holloway, G McGuire, L. Buckley, R. Cozzens, R. Schwartz, and G. J. Exarhos, in *Smart Structures and Materials* 2000: *Electroactive Polymer Actuators and Devices (EAPAD)*, Y Bar-Cohen, Editor, Proceedings of SPIE 3967, 225 (2000).
3. *Transparent Conducting Oxides* in the August 2000 MRS Bulletin, Volume 25, #8 EL Fleischer, editor, MRS, Warrendale, Pa., pp. 15–65 (2000).
4. G. J. Exarhos, A. Rose, and C. F. Windisch Jr., Thin Solid Films, 308–309, 56 (1997).
5. B. H. Bairamov, A. Heinrich, G. Irner, V. V. Toporov, and E. Ziegler, Phys. Stat. Sol., (B), 119, 227 (1983).
6. L. R. Pederson, L. A. Chick, and G. J. Exarhos, Preparation of Thin Ceramic Films Via an Aqueous Solution Route, U. S. Pat. No 4,880,772 (1989).
7. D. Vanderbilt, Phys. Rev. B, 41, 7892 (1990).
8. M. C. Payne, D.C. Allen, T. A. Arias, and J. D. Johannopoulus, Rev. Mod. Phys., 64, 1045 (1992).
9. J. P. Perdew and A. Zunger, Phys. Rev. B, 23, 5048 (1981).
10. H. J. Monkhorst and J. D. Pack, Phys. Rev. B, 13, 5188 (1976).
11. Yu. E. Roginskaya, O. V. Morozova, E. N. Lubnin, Yu. E. Ulitina, G. V. Lopukhova, and S. Trasatti, Langmuir, 13, 4621 (1997).
12. L. C. Schumacher and I. B. Holzhueter, Electrochim. Acta, 35, 975 (1990).
13. P. Nkeng, G. Poillerat, J. F. Koenig, and P. Chartier, J. Electrochem. Soc., 142, 1777 (1995).
14. B. Lefez, P. Nkeng, J. Lopitaux and G. Poillerat, Mater. Res. Bull., 31, 1263 (1996).

15. W. J. King and A. C. C. Tseung, Electrochimica Acta, 19, 493 (1974).
16. See for example: B. D. Craig, Fundamental Aspects of Corrosion Films in Corrosion Science, Plenum Press, N.Y., 1991, p. 58.
17. N. K. Appandairajan and J. Gopalakrishnan, Proc. Indian Acad. Sci., 87 A, 115 (1978).
18. J. A. K. Tareen, A. Malecki, J. P. Doumerc, J. C. Launay, P. Dordor, M. Pouchard, and P. Hagenmuller, Mat. Res. Bull., 19,989 (1984).

What is claimed is:

1. An infrared transparent conducting oxide optical film adhered to an infrared transparent substrate, said film comprising:
   a mixed transition metal oxide spinel compound of the form $M1_{1-x}M2_xO_{4/3}$ wherein M1 and M2 are two different transition metals, x is less than or equal to 1, and each of said M1 and M2 is selected from the group consisting of Fe, Co, Ni, Ru, Rh, Pd, Os, Ir, and Pt.

2. An infrared transparent conducting oxide optical film as recited in claim 1, wherein said mixed transition metal oxide spinel compound is $NiCo_2O_4$.

3. An infrared transparent conducting oxide optical film as recited in claim 1, wherein M1 is selected from the group consisting of Pd, Co and Ni.

4. An infrared transparent conducting oxide optical film as recited in claim 3, wherein M2 is selected from the group consisting of Pd, Co and Ni.

5. An infrared transparent conducting oxide optical film as recited in claim 1, further comprising Li.

6. An infrared transparent conducting oxide optical film as recited in claim 1, further comprising up to about 10 mole percent Li relative to the total number of moles of M1 and M2.

7. An infrared transparent conducting oxide optical film as recited in claim 1, wherein said infrared transparent substrate is selected from the group consisting of sapphire, silicon, zinc selenide and quartz.

8. An infrared transparent conducting oxide optical film as recited in claim 5, wherein said Li is 10 mole percent relative to the total number of moles of M1 and M2.

9. An infrared transparent conducting oxide optical film as recited in claim 7, wherein said infrared transparent substrate is selected from silicon or quartz.

10. An infrared transparent conducting oxide optical film as recited in claim 9, wherein said infrared transparent substrate comprises silicon.

11. An infrared transparent conducting oxide optical film adhered to an infrared transparent substrate, said film comprising:
    a mixed transition metal oxide spinel compound of the form $M1_{1-x}M2_xO_{4/3}$ wherein M1 and M2 are two different transition metals and x is less than or equal to 1; and
    Li.

12. An infrared transparent conducting oxide optical film as recited in claim 11, comprising up to about 10 mole percent Li relative to the total number of moles of M1 and M2.

13. An infrared transparent conducting oxide optical film as recited in claim 11, wherein said infrared transparent substrate is selected from silicon or quartz.

14. An infrared transparent conducting oxide optical film as recited in claim 13, wherein said infrared transparent substrate comprises silicon.

15. An infrared transparent conducting oxide optical film adhered to an infrared transparent substrate, said film comprising a mixed transition metal oxide spinel compound having a formula of $PdNi_2O_4$.

* * * * *